US006580334B2

(12) United States Patent
Simbürger et al.

(10) Patent No.: US 6,580,334 B2
(45) Date of Patent: Jun. 17, 2003

(54) MONOLITHICALLY INTEGRATED TRANSFORMER

(75) Inventors: Werner Simbürger, Haar (DE); Hans-Dieter Wohlmuth, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/859,831

(22) Filed: May 17, 2001

(65) Prior Publication Data

US 2001/0033204 A1 Oct. 25, 2001

Related U.S. Application Data

(63) Continuation of application No. PCT/EP00/09129, filed on Sep. 18, 2000.

(30) Foreign Application Priority Data

Sep. 17, 1999 (DE) ........................................ 199 44 741

(51) Int. Cl.[7] .............................. H03H 7/42; H01F 5/00
(52) U.S. Cl. .................................... 333/24 R; 336/200
(58) Field of Search ................................ 333/24 R, 25, 333/26; 336/232, 200

(56) References Cited

U.S. PATENT DOCUMENTS

| | | | | |
|---|---|---|---|---|
| 4,816,784 A | | 3/1989 | Rabjohn | 333/24 R |
| 4,992,769 A | * | 2/1991 | Oppelt | 336/180 |
| 5,610,433 A | * | 3/1997 | Merrill et al. | 257/531 |
| 5,781,071 A | * | 7/1998 | Kusunoki | 330/269 |

FOREIGN PATENT DOCUMENTS

| | | | |
|---|---|---|---|
| DE | 41 17 878 A1 | 12/1991 | H01F/17/04 |
| DE | 43 17 545 A1 | 12/1993 | H01F/19/04 |
| WO | WO 91/07765 | 5/1991 | H01F/27/30 |
| WO | WO 92//04723 | 3/1992 | H01F/27/28 |
| WO | WO 01/22444 A1 | 3/2001 | H01F/27/28 |

* cited by examiner

*Primary Examiner*—Robert Pascal
*Assistant Examiner*—Dean Takaoka
(74) *Attorney, Agent, or Firm*—Laurence A. Greenberg; Werner H. Stemer; Ralph E. Locher

(57) ABSTRACT

A monolithic integrated transformer, especially for high frequency application in for example GSM-mobile components wherein a coupling factor is attained by using slotted windings and components introduced therein from another winding. The transformer can be produced according to standard silicon bipolar technology with three metallic layers. The production of the transformer do not involve any additional expenditures.

10 Claims, 3 Drawing Sheets

MONOLITHICALLY INTEGRATED TRANSFORMER

CROSS-REFERENCE TO RELATED APPLICATION

This application is a continuation of copending International Application No. PCT/EP00/09129, filed Sep. 18, 2000, which designated the United States.

BACKGROUND OF THE INVENTION

FIELD OF THE INVENTION

The invention relates to a monolithically integrated transformer, in particular a high-frequency transformer with the highest possible coupling factor.

A transformer of this type is disclosed in U.S. Pat. No. 4,816,784, in which the conductor tracks of the winding and crossovers are disposed in such a way that conductor tracks located beside one another belong to different windings, in order to achieve a particularly good magnetic coupling.

SUMMARY OF THE INVENTION

It is accordingly an object of the invention to provide a monolithically integrated transformer that overcomes the above-mentioned disadvantages of the prior art devices of this general type, which has a smaller number of secondary windings than primary windings and which, utilizing three possible metallization planes of conventional silicon bipolar semiconductor technology, has a particularly high coupling factor.

With the foregoing and other objects in view there is provided, in accordance with the invention, a monolithically integrated transformer. The transformer contains a primary winding having conductor tracks, and a secondary winding having conductor tracks. The secondary winding has slots formed therein such that the conductor tracks of the secondary winding are connected in parallel, in which, between the conductor tracks of the secondary winding connected in parallel, at least parts of the primary winding are present.

The essential idea of the present invention is to provide windings with slots and to connect conductor tracks belonging to the winding in parallel and, between these parallel-connected conductor tracks, to dispose the conductor tracks of another winding. In this case, the other winding can, for example, also be slotted in a corresponding manner.

In accordance with an added feature of the invention, both the primary winding and the secondary winding have connecting regions and crossing regions. The conductor tracks of the primary winding and the secondary winding are substantially concentrically disposed circular segment-shaped conductor tracks.

In accordance with an additional feature of the invention, the conductor tracks of the primary winding and the secondary winding each have a cross section increasing linearly in a radial direction.

In accordance with a further feature of the invention, the primary winding and the secondary winding are formed from three metallization layers. The primary winding, apart from the connecting regions and the crossing regions, extends completely over two of the three metallization layers. The secondary winding, apart from the connecting regions and the crossing regions, extends completely over the three metallization layers.

In accordance with a further added feature of the invention, the primary winding has a tap, a first primary winding part and a second primary winding part connected to each other through the tap, and in a radial direction, the conductor tracks of the first primary winding part alternate with conductor tracks of the second primary winding part and, in their projection, run in mirror image fashion on a common plane.

With the foregoing and other objects in view there is further provided, in accordance with the invention, a monolithically integrated transformer. The transformer contains a secondary winding having conductor tracks, and a primary winding having conductor tracks. The primary winding has slots formed therein such that the conductor tracks of the primary winding are connected in parallel, in which, between the conductor tracks of the primary winding connected in parallel, at least parts of the secondary winding are present.

Other features which are considered as characteristic for the invention are set forth in the appended claims.

Although the invention is illustrated and described herein as embodied in a monolithically integrated transformer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENT

Figure 1:
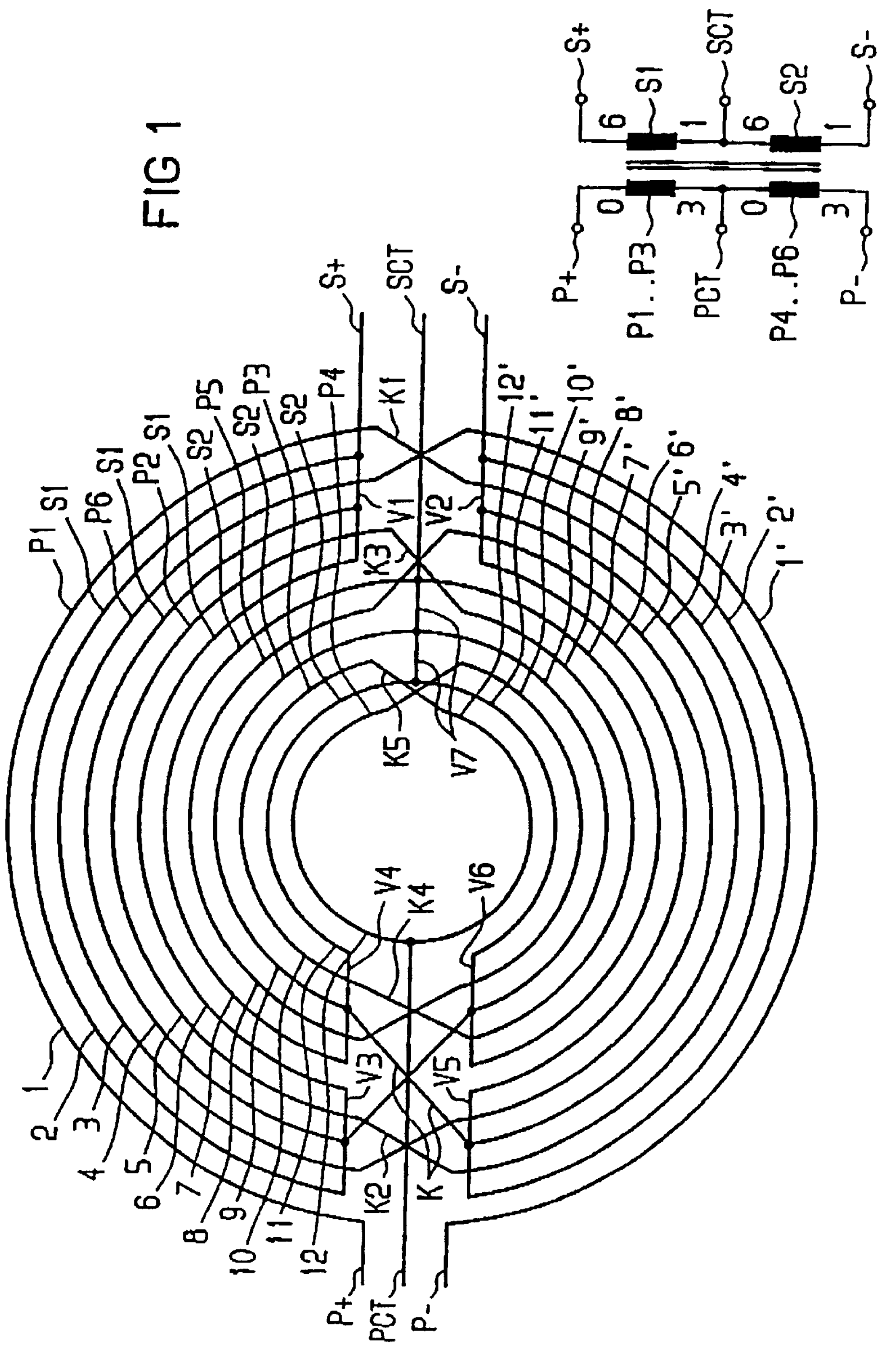
FIG. 1 is an illustration of a winding scheme and a circuit diagram of a transformer according to the invention.

In all the figures of the drawing, sub-features and integral parts that correspond to one another bear the same reference symbol in each case. Referring now to the figures of the drawing in detail and first, particularly, to FIG. 1 thereof, there is shown a winding scheme of a transformer according to the invention using a 6:2 step-up transformer with a primary center tap PCT and a secondary center tap SCT. Between a first primary terminal P+ and the primary center tap PCT there are three turns P1, P2 and P3; between the primary center tap PCT and a second primary terminal P− there are a further three turns P4, P5 and P6. Between a first secondary terminal S+ and the secondary center tap SCT there is a turn S1 containing three parallel-connected conductor tracks. Between the secondary center tap SCT and a second terminal of the secondary winding there is a turn S2, likewise containing three parallel-connected conductor tracks. In the winding scheme of FIG. 1, conductor tracks apart from connecting regions V1 . . . V6 and crossing regions K, K1 . . . K5, are disposed in the form of concentric circles, which are designated in order from 1 to 12 with a decreasing radius in FIG. 1. The first primary winding P1 contains an outer conductor track 1 which is connected to a conductor track 3' via a half crossing K1, and a half crossing K2, which produces a connection to the conductor track 5 and therefore to the winding P2. The conductor track 5 of the winding P2 is connected to a conductor track 8' through a half crossing K3, and a half crossing K4 is connected to a conductor track 10 already belonging to the winding P3. The conductor track 10 belonging to the winding P3 is connected to the primary center tap PCT via a half crossing K5 and a conductor track 12'. The windings P4, P5 and P6 are disposed in mirror image fashion thereto, the center tap PCT being connected via the conductor track 12 of the winding P4, and the other half of the crossing K5 being connected via the other half of the crossing K4, to the conductor track 8 which, for its part, already belongs to the winding P5. The winding P5 contains the conductor track 8, the other half of the crossing K3, the conductor track 5' and the other half of the crossing K2, which is connected to the conductor track 3. The winding P6 contains the conductor track 3, the other half of the crossing K1 and the conductor track 1' that is connected to the terminal P−. The first secondary winding S1 between the terminal S+ and the second center tap SCT is formed by a connecting region V1, three parallel-connected conductor tracks 2, 4 and 6, a connecting region V3, a half crossing region K, a connecting region V6, three parallel-connected conductor tracks 11', 9' and 7' and a connecting region V7. The second secondary winding S2 between the second center tap SCT and the terminal S− is formed by a connecting region V2, three parallel-connected conductor tracks 2', 4' and 6', a connecting element V5, a half crossing region K, a connecting region V4, three parallel-connected conductor tracks 7, 9 and 11 and the connecting region V7. Both the two primary windings and the two secondary windings virtually form two mirror-image spirals lying inside each other, primary windings, apart from connecting and crossing regions lying within the secondary windings. By a substantially circular and concentric configuration of the conductor tracks, particularly good magnetic coupling is achieved. In this case, the circular form is approximated in the practical implementation by a polygon with a number of corners N>4.

Figure 2:
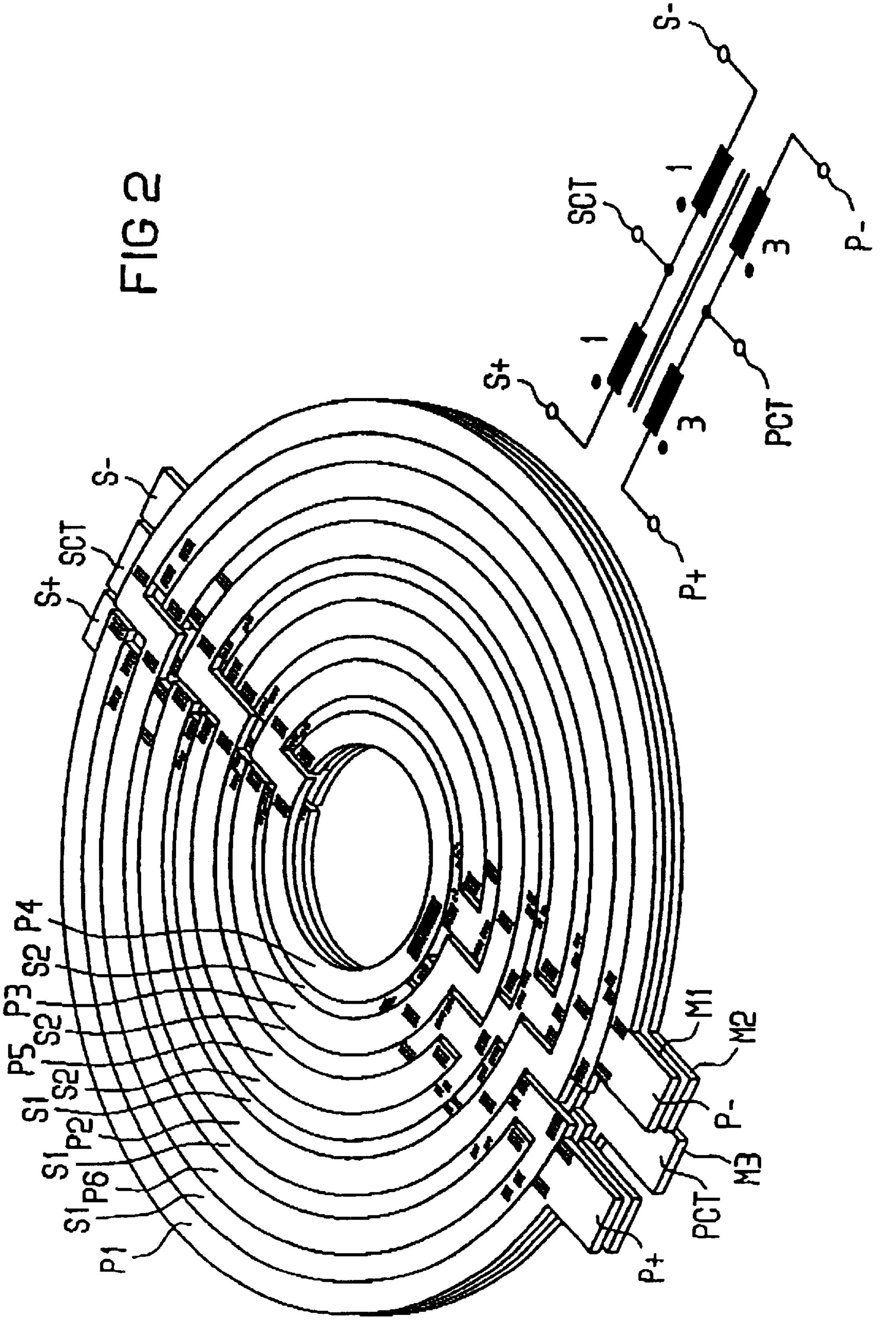
FIG. 2 is a top, perspective view of the transformer shown in FIG. 1.
Figure 3:
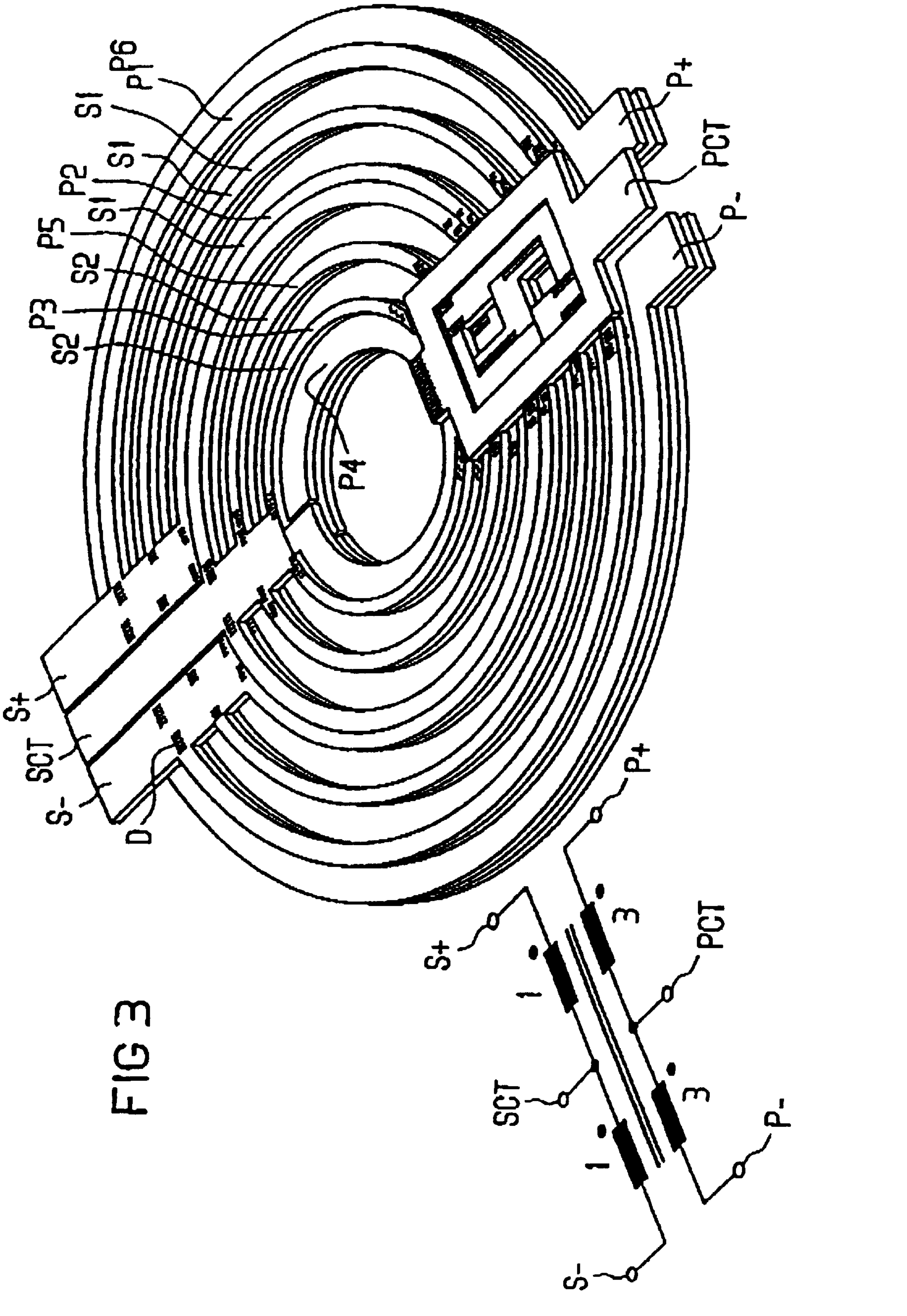
FIG. 3 is a bottom, perspective view of the transformer shown in FIG. 2.

FIGS. 2 and 3 show a three-dimensional illustration of the exemplary transformer, FIG. 2 being viewed from a top side and FIG. 3 from the underside. FIG. 2 makes it clear that the primary windings are located in two metallization layers M1 and M2 between which through-contact is made in the area of the connecting and crossing regions at the point where the terminals P+ and P− are also present. The primary center tap PCT is located in a third metallization layer M3 and, in the area of the connecting and crossing region, is connected via plated-through contacts to conductor tracks of the first and second metallization layer M1, M2. FIG. 3 makes it clear that the secondary windings outside the connecting and crossing regions extend over all three metallization layers and, via plated-through contacts D, are connected to the secondary terminals S+, SCT and S− located in the third metallization layer M3. Utilizing all three metallization layers on the secondary side minimizes the nonreactive resistance of the secondary winding, which although advantageous, is not absolutely necessary for the invention.

In a further advantageous refinement of the invention, the slotted secondary windings, as in FIGS. 2 and 3, are dimensioned such that the nonreactive resistance is of the same magnitude, because of the greater circumference in each part-winding, or in the conductor tracks 2, 4, 6, 7, 9 and 11 and in the conductor tracks 2', 4', 6', 7', 9' and 11'. This is achieved by the cross section of the conductor tracks of the secondary winding increasing linearly in the radial direction. Since the thickness of the metallization layers is largely constant, this virtually signifies a linear increase in the conductor track width.

Of course, instead of the secondary winding, the primary winding can also be slotted in a corresponding manner.

However, in addition to the secondary windings, the primary windings can also be slotted at the same time, windings then virtually lying inside one another and the parallel-connected conductor tracks of different windings alternating in the radial direction.

The absolute size of the transformer is virtually unimportant, but merely determines the frequency range of the optimum function or the inherent resonant frequencies. The diameter of an optimum transformer for frequencies from 800 to 900 MHz is, for example, about 400 μm.

By use of transformers of this type, completely monolithically integrated high-frequency power amplifiers with high efficiency can be implemented in silicon bipolar technology for mobile radio or GSM mobile parts, since, by using these, high-frequency matching between high-frequency amplifier stages becomes possible without external components.

We claim:

1. A monolithically integrated transformer, comprising:

a primary winding having conductor tracks; and a secondary winding having conductor tracks, said secondary winding having slots formed therein such that said conductor tracks of said secondary winding are electrically connected in parallel, in which, between said conductor tracks, at least parts of said primary winding are present.

2. The monolithically integrated transformer according to claim 1, wherein both said primary winding and said secondary winding have connecting regions and crossing regions, said conductor tracks of said primary winding and said secondary winding are substantially concentrically disposed circular segment-shaped conductor tracks.

3. The monolithically integrated transformer according to claim 1, wherein said conductor tracks of said primary winding and said secondary winding each have a cross section increasing linearly in a radial direction.

4. The monolithically integrated transformer according to claim 2, wherein:

said primary winding and said secondary winding are formed from three metallization layers;

said primary winding, apart from said connecting regions and said crossing regions, extends completely over two of said three metallization layers; and said secondary winding, apart from said connecting regions and said crossing regions, extends completely over said three metallization layers.

5. The monolithically integrated transformer according to claim 1, wherein said primary winding has a tap, a first primary winding part and a second primary winding part connected to each other through said tap, and in a radial direction, said conductor tracks of said first primary winding part alternate with conductor tracks of said second primary winding part and, in their projection, run in mirror image fashion on a common plane.

6. A monolithically integrated transformer, comprising:

a secondary winding having conductor tracks; and a primary winding having conductor tracks, said primary winding having slots formed therein such that said conductor tracks of said primary winding are electrically connected in parallel, in which, between said conductor tracks, at least parts of said secondary winding are present.

7. The monolithically integrated transformer according to claim 6, wherein both said primary winding and said secondary winding have connecting regions and crossing regions, said conductor tracks of said primary winding and said secondary winding are substantially concentrically disposed circular segment-shaped conductor tracks.

8. The monolithically integrated transformer according to claim 6, wherein said conductor tracks of said primary winding and said secondary winding each have a cross section increasing linearly in a radial direction.

9. The monolithically integrated transformer according to claim 7, wherein:

said primary winding and said secondary winding are formed from three metallization layers;

said primary winding, apart from said connecting regions and said crossing regions, extends completely over two of said three metallization layers; and said secondary winding, apart from said connecting regions and said crossing regions, extends completely over said three metallization layers.

10. The monolithically integrated transformer according to claim 6, wherein said primary winding has a tap, a first primary winding part and a second primary winding part connected to each other through said tap, and in a radial direction, said conductor tracks of said first primary winding part alternate with conductor tracks of said second primary winding part and, in their projection, run in mirror image fashion on a common plane.

* * * * *